United States Patent
Payer et al.

(10) Patent No.: US 11,221,826 B2
(45) Date of Patent: Jan. 11, 2022

(54) PARALLEL ROUNDING FOR CONVERSION FROM BINARY FLOATING POINT TO BINARY CODED DECIMAL

(71) Applicant: International Business Machines Corporation, Armonk, NY (US)

(72) Inventors: Stefan Payer, Stuttgart (DE); Silvia Melitta Mueller, Altdorf (DE); Razvan Peter Figuli, Remchingen (DE); Revital Arieli, Ness Ziona (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 246 days.

(21) Appl. No.: 16/525,768

(22) Filed: Jul. 30, 2019

(65) Prior Publication Data
US 2021/0034329 A1     Feb. 4, 2021

(51) Int. Cl.
*G06F 7/499* (2006.01)
*H03M 7/12* (2006.01)
*H03M 7/24* (2006.01)

(52) U.S. Cl.
CPC .......... *G06F 7/49947* (2013.01); *H03M 7/12* (2013.01); *H03M 7/24* (2013.01)

(58) Field of Classification Search
CPC ...................... H03M 7/12; H03M 7/24; G06F 7/49947–49984
See application file for complete search history.

(56) References Cited

U.S. PATENT DOCUMENTS

| | | | |
|---|---|---|---|
| 3,842,414 A | 10/1974 | Chen | |
| 5,170,371 A | 12/1992 | Darley | |
| 5,235,533 A | 8/1993 | Sweedler | |
| 5,251,321 A * | 10/1993 | Boothroyd | H03M 7/12 341/84 |
| 7,921,144 B2 | 4/2011 | Hack | |
| 8,364,734 B2 | 1/2013 | Carlough et al. | |
| 8,719,322 B2 | 5/2014 | Bishop | |
| 8,977,663 B2 | 3/2015 | Lee et al. | |
| 2006/0047739 A1 | 3/2006 | Schulte | |
| 2006/0101425 A1 | 5/2006 | Donovan | |

(Continued)

OTHER PUBLICATIONS

A. A. Wahba and H. A. H. Fahmy, "Area Efficient and Fast Combined Binary/Decimal Floating Point Fused Multiply Add Unit," in IEEE Transactions on Computers, vol. 66, No. 2, pp. 226-239, Feb. 1, 2017, doi: 10.1109/TC.2016.2584067. (Year: 2017).*

(Continued)

*Primary Examiner* — Emily E Larocque
*Assistant Examiner* — Carlo Waje
(74) *Attorney, Agent, or Firm* — Cantor Colburn LLP; Margaret McNamara

(57) ABSTRACT

Embodiments of the invention are directed to a computer-implemented method of for parallel conversion to binary coded decimal format. The method includes receiving, by a floating point unit (FPU), a value in binary floating point (BFP) format. The BFP value includes an integer part and a fractional part. The FPU converts the BFP value to a binary coded decimal (BCD) value. In parallel to converting the BFP value to a BCD value, the FPU performs a rounding operation on the BFP value. The FPU receives the rounding information and operates on the BCD value accordingly.

20 Claims, 5 Drawing Sheets

(56) References Cited

U.S. PATENT DOCUMENTS

| | | | |
|---|---|---|---|
| 2006/0179090 | A1 | 8/2006 | Carlough |
| 2007/0061387 | A1 | 3/2007 | Carlough |
| 2008/0215659 | A1 | 9/2008 | Cowlishaw |
| 2008/0238736 | A1 | 10/2008 | Mathew et al. |
| 2010/0306632 | A1 | 12/2010 | Carlough |
| 2010/0312812 | A1 | 12/2010 | Wang |
| 2012/0124116 | A1* | 5/2012 | Yu .................. H03M 7/24 708/204 |
| 2012/0259906 | A1 | 10/2012 | Kan |
| 2013/0304785 | A1* | 11/2013 | Lutz .................. G06F 9/30025 708/497 |
| 2014/0046994 | A1 | 2/2014 | Kamoshida |
| 2014/0115023 | A1 | 4/2014 | Ayoub |
| 2016/0092169 | A1* | 3/2016 | Lutz .................. G06F 7/485 708/205 |
| 2016/0098248 | A1 | 4/2016 | Carlough |
| 2016/0098249 | A1 | 4/2016 | Carlough et al. |
| 2017/0199724 | A1* | 7/2017 | Cowlishaw ........ G06F 7/49968 |

OTHER PUBLICATIONS

S. Carlough, A. Collura, S. Mueller and M. Kroener, "The IBM zEnterprise-196 Decimal Floating-Point Accelerator," 2011 IEEE 20th Symposium on Computer Arithmetic, 2011, pp. 139-146, doi: 10.1109/ARITH.2011.27. (Year: 2011).*

M. DeJong, "A Floating-Point Binary to BCD Routine" in Compute! Issue 11 p. 66. Retrieved on [May 20, 2021], Retrieved from the Internet <https://www.atarimagazines.com/compute/issue11/31_1_A_FLOATING_255POINT_BINARY_TO_BCD_ROUTINE.php> (Year: 1981).*

Transmittal Form PTO/SB/21 signed Mar. 16, 2020.

IBM "List of IBM Patents or Patent Applications Treated as Related; (Appendix P)", Filed Jul. 30, 2019, 2 pages.

Stefan Payer et al., "Parallelized Rounding for Decimal Floating Point to Binary Coded Decimal Conversion," U.S. Appl. No. 16/525,720, filed Jul. 30, 2019.

* cited by examiner

… (1)

PARALLEL ROUNDING FOR CONVERSION FROM BINARY FLOATING POINT TO BINARY CODED DECIMAL

BACKGROUND

The present invention generally relates to conversion from binary floating point (BFP) to binary coded decimal format (BCD), and more specifically, to parallel rounding for conversion from BFP format to BCD format.

Modern high-performance computers typically operate internally in the binary number system. The binary system permits systems to cheaply, reliably, and accurately execute a modern application. However, a significant class of computer systems operates using the BCD format in which binary digits are divided into groups of four bits, with each of the groups, representing one of the decimal digits, zero through nine. These systems are often preferred in situations, in which large amounts of input data are processed.

SUMMARY

Embodiments of the present invention are directed to a computer-implemented method for parallel conversion to binary coded decimal format. A non-limiting example of the computer-implemented method includes receiving, by a floating point unit (FPU), a value in binary floating point (BFP) format. The BFP value includes an integer part and a fractional part. The FPU converts the BFP value to a binary coded decimal (BCD) value. In parallel to converting the BFP value to a BCD value, the FPU performs a rounding operation on the BFP value.

Other embodiments of the present invention implement the features of the above-described methods in computer systems and in computer program products.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
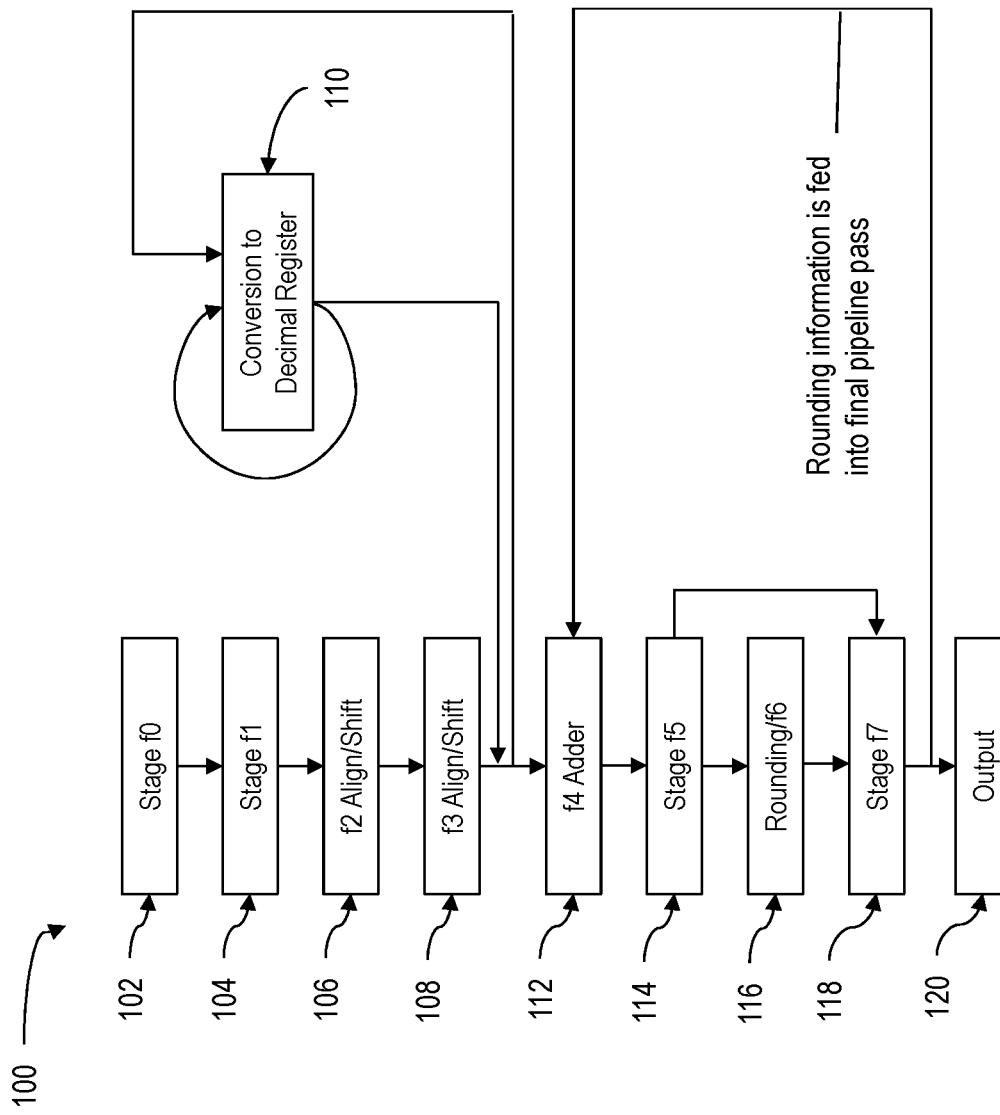
FIG. 1 depicts a pipeline in a floating point unit (FPU) according to one or more of the present invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describe having a communications path between two elements and do not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Embodiments of the present invention are directed to a floating point unit (FPU) that converts a binary floating point (BFP) value to a binary coded decimal (BCD) value. One of the embodiments described herein includes an FPU that converts a BFP value to a BCD value in parallel with a rounding operation on the BFP value. By performing the conversion in parallel to rounding, the FPU reduces the cycle time needed for outputting a rounded BCD value when compared to a conventional FPU. There are several advantages to performing operations using BCD values. BCD values are often used in banking and insurance related industries to help avoid calculation differences or errors that are common in calculations using BFP values. In addition, many non-integral values have an infinite representation in BFP, however some computer applications only operate on finite numbers and therefore require BCD values. These applications are further enhanced by speeding up the processing time to output a rounded BCD value.

In a modern computer application that processes large amounts of data, it can be advantageous to operate using BCD values over BFP values. In a typical microprocessor system, the FPU, also known as a math co-processor, is integrated with a central processing unit (CPU) and performs various mathematical operations such as addition, subtraction, multiplication, and division. In particular, the typical FPU is designed to perform the operation A*B+C, in which A, B, and C are floating point values. Some FPU hardware also provides built-in features to support other mathematical operations such as computation of transcendental functions.

A BFP value is expressed as a significand value multiplied by a base raised to an exponent (significand*(base^exponent)). BFP values are aligned on the left, such that they are normalized so that only one non-zero number appears to the left of a radix point. (The radix point is not explicitly encoded in this initial BFP representation, but is assumed to lie between the leftmost non-zero bit and the bit to the immediate right of that non-zero bit.). During operation, a conventional FPU passes the significand value through different stages of a processor pipeline, in which each stage requires one or more clock cycles for completion.

The processor pipeline of a conventional FPU performs a rounding operation and then converts the BFP value to a BCD value. In other words, the conversion operation is idle until after the completion of the rounding operation.

Depending upon the number of clock cycles between completion of the rounding operation and the beginning of the conversion operation, a conventional FPU is unnecessarily idle while waiting for the rounding operation to finish.

One or more embodiments of the present invention address the above-described shortcomings of the prior art by providing methods and systems that perform the conversion from a BFP value to a BCD value in parallel with rounding the BFP value. Depending upon the size of the BFP value, the rounding process will complete prior to the complete conversion of the BFP value to a BCD value. After conversion, the BCD value is rounded and output for further use. By parallelizing the conversions and rounding operations, the conversion operation is decoupled from the wait time required to complete the rounding operation and the FPU is more efficient.

FIG. 1 depicts an FPU 100 that parallelizes the conversion and rounding operations according to embodiments of the present invention. The process is essentially divided into two parts, a conversion part and a rounding part. The FPU 100 receives instructions from an instruction fetch unit (not shown) and an instruction scheduling unit (not shown) to convert a BFP value to a BCD value. A BFP value is received at stage f0 102 from a register file (not shown), which has been loaded from a load store unit (not shown). At stage f1 104, the BFP is decoded into the significand, base, and exponent. The significand includes an integer part and a fractional part that are separated by a radix point (implicitly defined as noted above as lying between the leftmost non-zero bit and the bit to the immediate right of that non-zero bit in the initial BFP representation). The FPU 100 is configured to receive BFP values individually or grouped together. Grouped BFP values include instructions relaying the number of bits in each individual BFP value. For example, the FPU 100 can process a 128-bit BFP value or two 64-bit BFP values. In the case of the two 64-bit values, the FPU 100 converts the two 64-bit BFP values sequentially. The FPU 100 is further configured to convert a BFP value having any number of bits. At stage f1 104, the FPU 100 also determines whether the position of bits is shifted based on the exponent.

At stage f2 106 and stage f3 108, the FPU 100 performs a bitwise operation to shift the bits to either the left or the right based on the exponent value. In some embodiments of the present invention, the shifting operation is performed in one stage and in other embodiments the shifting operation occurs in multiple stages.

The BFP value is transmitted to the conversion register 110, which converts a subset of the total bits of the BFP during each cycle. For example, a conversion register that converted 8 bits per cycle requires 8 cycles to fully convert a 64-bit BFP value. In some embodiments of the present invention, only the integer part of the BFP value is transmitted to the conversion register. In some embodiments of the present invention, each subset is sequentially transmitted from the conversion register to the adder 112 and in other embodiments, the fully converted BCD value is transmitted to the adder 112. For example, 8-bit converted subsets are transmitted until a full 64-bit BCD value is reassembled at the adder 112. In some embodiments of the present invention, the BFP value is converted into an intermediate value prior to conversion to a BCD value. At stage f5 114, the FPU 100 determines whether the value is a rounded BCD value that can be sent to stage f7 or if the BFP value needs to be sent to stage f6 116 for rounding.

In parallel to the conversion loop, a duplicated BFP value moves down the pipeline to stage f6 or the rounding operation 116. Rounding information is then looped back to the adder 112. In the instance that the conversion loop is transmitting duplicated subsets of the BCD value and the least significant bit has been transmitted, the adder 112 can add a rounding value to the least significant bit prior to conversion of the most significant bit of the BFP value. In the instance that the rounding information suggests that the BFP value does not need to be rounded up, the adder adds a 0. In the instance that the entire BCD is transmitted to the adder, the adder either adds or does not add a value to the full BCD value based on the rounding information. At stage f7 118, the BCD value is output 120. It should be appreciated by one of ordinary skill in the art that although FIG. 1 depicts a seven-stage processor pipeline, an FPU 100 according to embodiments of the present invention could operate with a fewer or greater number of stages depending upon the functionality of each stage.

As an example, consider a BFP value $0\times1.234A6*2^{\wedge}12$. For this example, the BFP value is written in hexadecimal, but should be understood to represent a value binary floating decimal format. In this example, "0×" is an indication that the value is written in hexadecimal, 1.234A6 is the significand in hexadecimal format, 2 is the base, and 12 is the exponent. For the significand, 1 is the integer part and 234A6 is the fractional part. The FPU 100 receives the BFP value and shifts the bits three places (as viewed in the hexadecimal format) such that the significand becomes 1234.A6. In this example, the bits are shifted three places because each digit would have been represented by four bits in binary format and four times three equals twelve. The significand in the BFP format is converted to an intermediate value and processed through the conversion loop. The conversion register 110 produces an unrounded BCD value, which is transmitted to the adder 112. In parallel to the conversion operation, the BFP value is processed through the rounding operation. In the example, A6 is rounded up to a one. The rounding information is transmitted to the adder 112 and the adder 112 adds a 1 to the BCD value. The final BCD value is 0d4661, in which "0d" is an indication that the value is in BCD format and 4661 is the value.

Figure 2:
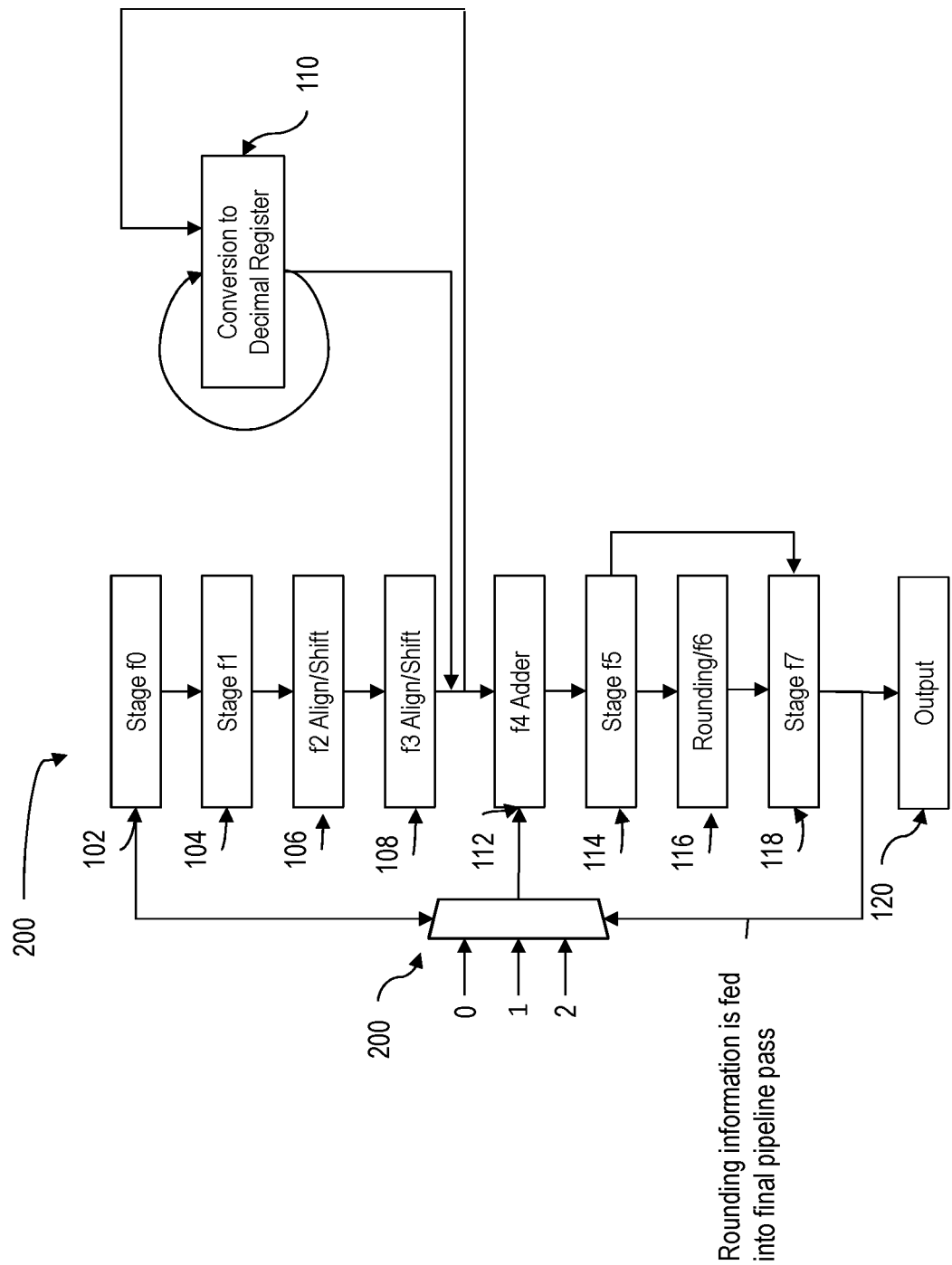
FIG. 2 depicts an illustration of a sign operation in an FPU according to one or more embodiments of the present invention.

FIG. 2 depicts an FPU 200 configured to account for sign values in the rounding operation. The conversion process operates on positive numbers and therefore negative BFP values are changed to positive BFP values prior to conversion to BCD values. If the BFP value is a positive number, the FPU 200 operates as described above. If the rounding information indicates the BFP value does not need to be rounded up, the multiplexer 200 transmits a 0 value to the adder 112. If the BFP value needs to be rounded up, the multiplexer transmits a 1 to the adder 112.

In some embodiments, a negative BFP value is introduced for conversion to a BCD value. To account for a negative BFP value, the FPU 200 uses a two's complement scheme. In the instance of a negative BFP value, the negative BFP value is converted to a positive BFP value at stage f0 102 and a positive BFP value is converted to a positive BCD value. In the instance that the rounding information indicates that value does not need to be rounded up, the multiplexer 200 transmits a 1, which is added to the BCD value by the adder 112. If the rounding information indicates that the BCD value needs to be rounded up, the multiplexer 200 transmits a 2 to be added to the BCD value.

Figure 3:
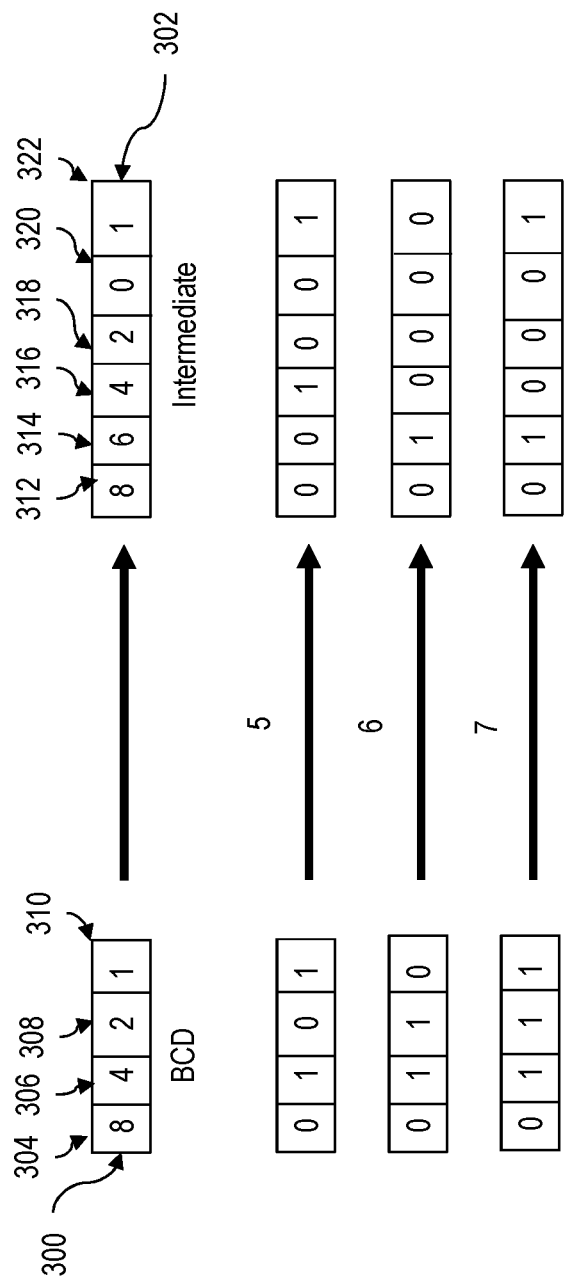
FIG. 3 depicts a table of values in binary coded decimal format and corresponding tables of values in intermediate format for use in implementing one or more embodiments in the present invention depicts a block diagram of a computer system for use in implementing one or more embodiments of the present invention.

FIG. 3 depicts tables of values converted from a BCD value 300 to an intermediate value 302. A 4-bit BCD value ranges from 0-9. Although 4 bits can be used to describe values 0-16, for BCD values 10-16 are illegal. The leftmost and first BCD bit 304 represents an eight. The second BCD bit 306 represents a four. The third BCD bit 308 represents a two. The fourth BCD bit 310 represents a one. To count higher than 9, the 4-bit BCD numbering system incorporates an additional 4 bits. In the intermediate format 302, the numbers 0-9 are represented by six bits. The first five intermediate bits 312-320 include a single one bit and the rest are zero bits. The sixth intermediate bit 322 can be either a 1 or a 0 and represents a one or a zero. The first intermediate bit 312 represents an eight. The second intermediate bit 314 represents a six. The third intermediate bit 316 represents a four. The fourth intermediate bit 318 represents a two. The fifth intermediate bit 320 represents a zero. For example, a seven in BCD is represented as 0111. In the intermediate format, a seven is represented as 010001, in which there is a single 1 bit in the second intermediate bit 314 representing a six and a 1 bit in the sixth bit representing a one. The six is added to one to reach a seven. A transformation from a 5 and a 6 in BCD to a respective 5 and 6 in intermediate format is also shown in FIG. 3.

Figure 4:
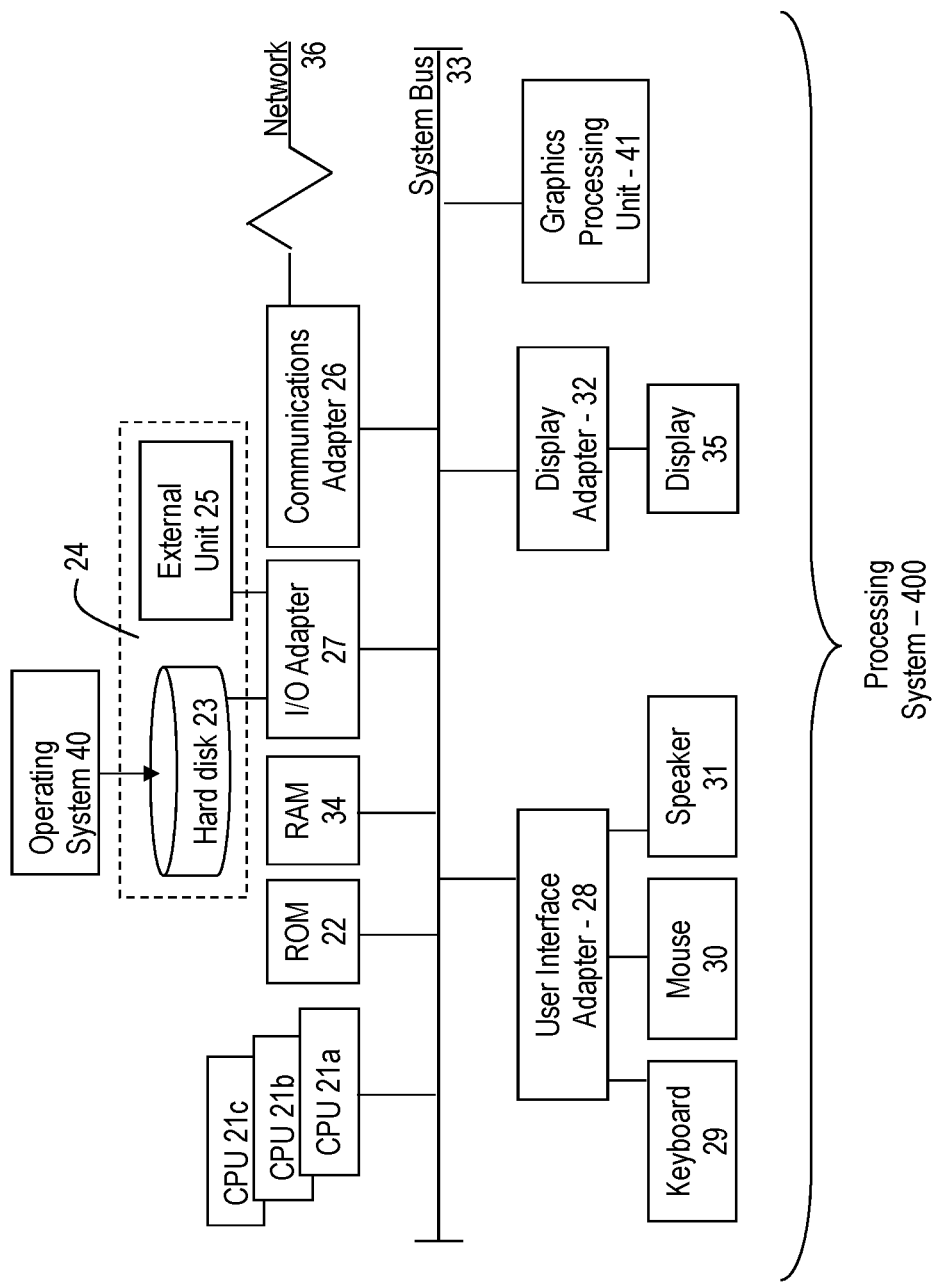
FIG. 4 depicts a block diagram of a computer system for use in implementing one or more embodiments of the present invention.

Referring to FIG. 4, there is shown an embodiment of a processing system 400 for implementing the teachings herein. In this embodiment, the system 400 has one or more central processing units (processors) 21a, 21b, 21c, etc. (collectively or generically referred to as processor(s) 21). In one or more embodiments, each processor 21 may include a reduced instruction set computer (RISC) microprocessor. Processors 21 are coupled to system memory 34 and various other components via a system bus 33. Read only memory (ROM) 22 is coupled to the system bus 33 and may include a basic input/output system (BIOS), which controls certain basic functions of system 400.

FIG. 4 further depicts an input/output (I/O) adapter 27 and a network adapter 26 coupled to the system bus 33. I/O adapter 27 may be a small computer system interface (SCSI) adapter that communicates with a hard disk 23 and/or external storage drive 25 or any other similar component. I/O adapter 27, hard disk 23, and external storage device 25 are collectively referred to herein as mass storage 24. Operating system 40 for execution on the processing system 400 may be stored in mass storage 24. A network adapter 26 interconnects bus 33 with an outside network 36 enabling data processing system 400 to communicate with other such systems. A screen (e.g., a display monitor) 35 is connected to system bus 33 by display adaptor 32, which may include a graphics adapter to improve the performance of graphics intensive applications and a video controller. In one embodiment, adapters 27, 26, and 32 may be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 all interconnected to bus 33 via user interface adapter 28, which may include, for example, a Super I/O chip integrating multiple device adapters into a single integrated circuit.

In exemplary embodiments, the processing system 400 includes a graphics processing unit 41. Graphics processing unit 41 is a specialized electronic circuit designed to manipulate and alter memory to accelerate the creation of images in a frame buffer intended for output to a display. In general, graphics processing unit 41 is very efficient at manipulating computer graphics and image processing and has a highly parallel structure that makes it more effective than general-purpose CPUs for algorithms where processing of large blocks of data is done in parallel.

Thus, as configured in FIG. 4, the system 400 includes processing capability in the form of processors 21, storage capability including system memory 34 and mass storage 24, input means such as keyboard 29 and mouse 30, and output capability including speaker 31 and display 35. In one embodiment, a portion of system memory 34 and mass storage 24 collectively store an operating system coordinate the functions of the various components shown in FIG. 4.

Figure 5:
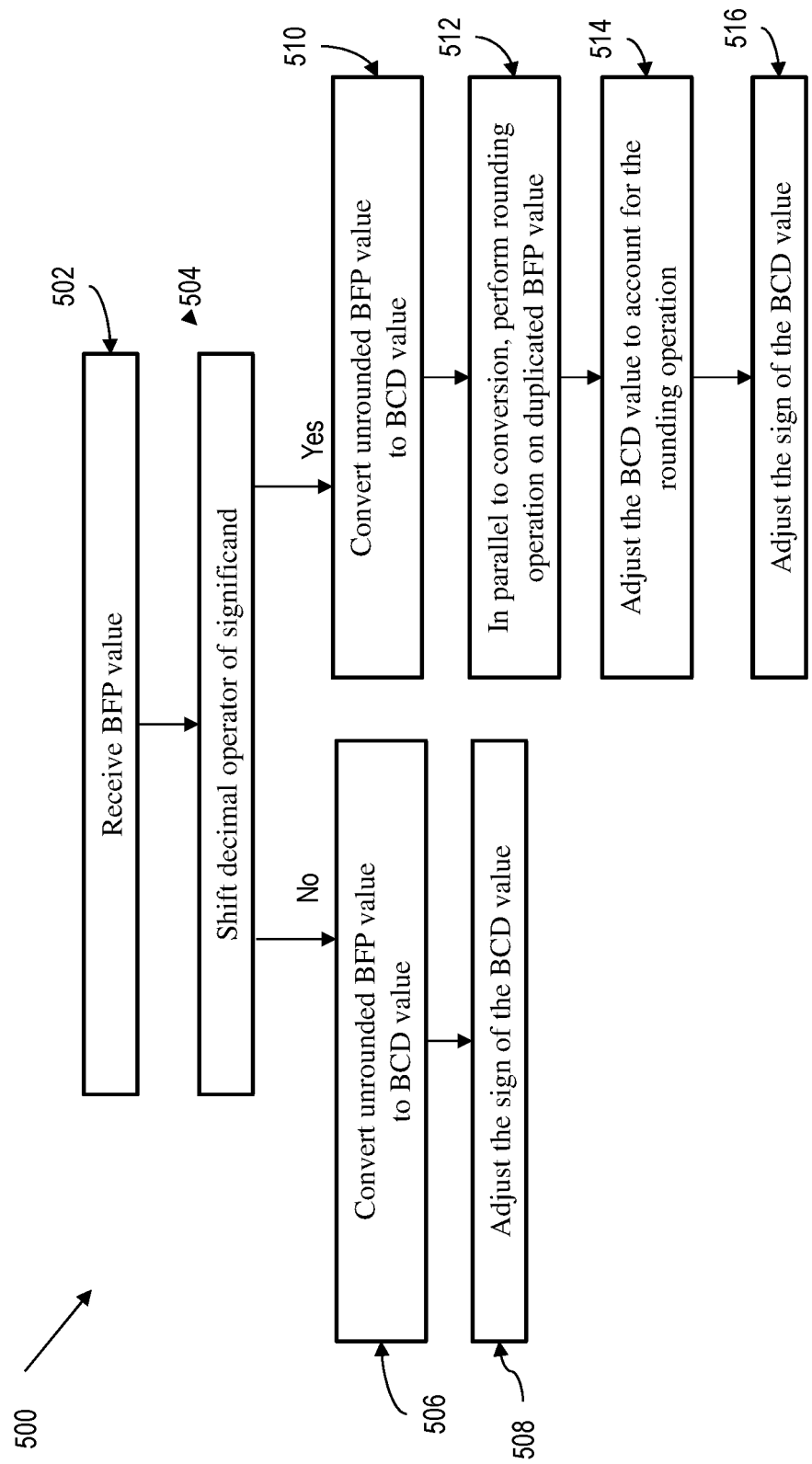
FIG. 5 depicts a flow diagram of a method for converting a binary floating pointing value to a binary coded value according to one or more embodiments of the invention.

FIG. 5 depicts a flow diagram of a method for a parallel conversion of a BFP value to a BCD value according to one or more embodiments of the invention. The method 500 includes receiving a BFP value at the FPU at block 502. If the BFP value is negative, the FPU changes the negative BFP value to a positive BFP value. At block 504 the FPU performs a bit shifting operation based on an exponent of the BFP value. At this point, the FPU determines whether a decimal value remains or is the BFP value an integer. If the BFP value is an integer, the BFP value is converted to a BCD value and the BCD value is output at block 506. At block 508, the FPU adjusts the sign of the BCD value to negative to comport with an original negative BFP value. In some embodiments of the present invention, the FPU discards the fractional part and treats the BFP value as an integer. For example, an application may recognize a source of a BFP value and detect a number of significant digits in the BFP value that is greater than a threshold amount that the application requires. In other embodiments, the FPU adds a predetermined fractional part. For example, an application may recognize a source of a BFP value and detect a number of significant digits in the BFP value that is lower than a threshold amount that an application requires.

If the BFP value has a decimal part, the integer part of the BFP value is converted to a BCD value and the BCD value is sent to an adder at block 510. In parallel to the conversion operation, the FPU rounds the BFP value and transmits rounding information at block 512. The rounding information includes whether the BCD value remains the same or is rounded up. At block 514, the FPU adjusts the value of the BCD value based on the rounding information. At block 516, the FPU adjusts the sign of the BCD value to comport with the sign of the original BFP value.

Additional processes may also be included. It should be understood that the processes depicted in FIG. 5 represent illustrations, and that other processes may be added or existing processes may be removed, modified, or rearranged without departing from the scope and spirit of the present disclosure.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
   receiving, by a floating point unit (FPU), a binary floating point (BFP) value, wherein the BFP value comprises a significand, and wherein the significand comprises an integer part and a fractional part;
   transmitting, by the FPU, the integer part of the BFP to a conversion register and a duplicate BFP value to an adder;
   converting, by the conversion register, the integer part of the BFP value to a binary coded decimal (BCD) value and transmitting the BCD value to the adder;
   determining, in parallel to the converting, whether to round the BCD value received from the conversion register, based on a fractional part of the duplicate BFP value; and
   performing, in parallel to the converting and by the adder, a rounding operation on the BCD value based on the rounding determination.

2. The computer-implemented method of claim 1, wherein the BFP received from the FPU is a negative BFP value, the method further comprises:
   prior to converting the integer part of the BFP value to the binary coded decimal (BCD) value, modifying the BFP value from the negative BFP value to a positive BFP value; and
   subsequent to converting the integer part of the BFP value to the binary coded decimal (BCD) value, modifying the BCD value from a positive BCD value to a negative BCD value.

3. The computer-implemented method of claim 1, wherein the BFP value further comprises a base and an exponent.

4. The computer-implemented method of claim 3 further comprising performing a bit shifting operation based on the exponent of the BFP value.

5. The computer-implemented method of claim 1, wherein converting the integer part of the BFP value to the BCD value comprises:
   converting the BFP value to an intermediate value; and
   converting the intermediate value to the BCD value.

6. The computer-implemented method of claim 1, wherein the BFP value comprises a first set of bits and the method further comprises:
   converting a subset of bits of the first set of bits during a respective cycle of a plurality of cycles, wherein a least significant bit of the BFP value is converted prior to a most significant bit of the BFP value; and
   performing the rounding operation on the least significant bit prior to completing conversion of the first set of bits from the BFP value to the BCD value.

7. The computer-implemented method of claim 1, wherein the rounding operation is performed on a fully converted BCD value.

8. A system comprising:
   a memory having computer readable instructions; and
   one or more processors for executing the computer readable instructions, the computer readable instructions controlling the one or more processors to perform operations comprising:
   receiving, by a floating point unit (FPU), a binary floating point (BFP) value, wherein the BFP value comprises a significand, and wherein the significand comprises an integer part and a fractional part;
   transmitting, by the FPU, the integer part of the BFP to a conversion register and a duplicate BFP value to an adder;
   converting, by the conversion register, the integer part of the BFP value to a binary coded decimal (BCD) value and transmitting the BCD value to the adder;
   determining, in parallel to the converting, whether to round the BCD value received from the conversion register, based on a fractional part of the duplicate BFP value; and
   performing, in parallel to the converting and by the adder, a rounding operation on the BCD value based on the rounding determination.

9. The system of claim 8, wherein the BFP received from the FPU is a negative BFP value, and wherein the operations further comprise:
   prior to converting the integer part of the BFP value to the binary coded decimal (BCD) value, modifying the BFP value from the negative BFP value to a positive BFP value; and
   subsequent to converting the integer part of the BFP value to the binary coded decimal (BCD) value, modifying the BCD value from a positive BCD value to a negative BCD value.

10. The system of claim 8, wherein the BFP value further comprises a base and an exponent.

11. The system of claim 10, wherein the operations further comprise performing a bit shifting operation based on the exponent of the BFP value.

12. The system of claim 8, wherein converting the integer part of the BFP value to the BCD value comprises:
converting the BFP value to an intermediate value; and
converting the intermediate value to the BCD value.

13. The system of claim 8, wherein the BFP value comprises a first set of bits and the operations further comprise:
converting a subset of bits of the first set of bits during a respective cycle of a plurality of cycles, wherein a least significant bit of the BFP value is converted prior to a most significant bit of the BFP value; and
performing the rounding operation on the least significant bit prior to completing conversion of the first set of bits from the BFP value to the BCD value.

14. The system of claim 8, wherein the rounding operation is performed on a fully converted BCD value.

15. A computer program product comprising a computer readable storage medium having program instructions embodied therewith, the program instructions executable by a processor to cause the processor to perform operations comprising:
receiving, by a floating point unit (FPU), a binary floating point (BFP) value, wherein the BFP value comprises a significand, and wherein the significand comprises an integer part and a fractional part;
transmitting, by the FPU, the integer part of the BFP to a conversion register and a duplicate BFP value to an adder;
converting, by the conversion register, the integer part of the BFP value to a binary coded decimal (BCD) value and transmitting the BCD value to the adder;
determining, in parallel to the converting, whether to round the BCD value received from the conversion register, based on a fractional part of the duplicate BFP value; and
performing, in parallel to the converting and by the adder, a rounding operation on the BCD value based on the rounding determination.

16. The computer program product of claim 15, wherein the BFP received from the FPU is a negative BFP value, and wherein the operations further comprise:
prior to converting the integer part of the BFP value to the binary coded decimal (BCD) value, modifying the BFP value from the negative BFP value to a positive BFP value; and
subsequent to converting the integer part of the BFP value to the binary coded decimal (BCD) value, modifying the BCD value from a positive BCD value to a negative BCD value.

17. The computer program product of claim 15, wherein the BFP value further comprises a base and an exponent.

18. The computer program product of claim 17, wherein the operations further comprise performing a bit shifting operation based on the exponent of the BFP value.

19. The computer program product of claim 15, wherein converting the integer part of the BFP value to the BCD value comprises:
converting the BFP value to an intermediate value; and
converting the intermediate value to the BCD value.

20. The computer program product of claim 15, wherein the BFP value comprises a first set of bits and the operations further comprise:
converting a subset of bits of the first set of bits during a respective cycle of a plurality of cycles, wherein a least significant bit of the BFP value is converted prior to a most significant bit of the BFP value; and
performing the rounding operation on the least significant bit prior to completing conversion of the first set of bits from the BFP value to the BCD value.

* * * * *